United States Patent [19]

Borland

[11] Patent Number: 5,814,866
[45] Date of Patent: Sep. 29, 1998

[54] SEMICONDUCTOR DEVICE HAVING AT LEAST ONE FIELD OXIDE AREA AND CMOS VERTICALLY MODULATED WELLS (VMW) WITH A BURIED IMPLANTED LAYER FOR LATERAL ISOLATION HAVING A FIRST PORTION BELOW A WELL, A SECOND PORTION FORMING ANOTHER, ADJACENT WELL, AND A VERTICAL PO

[75] Inventor: John O. Borland, South Hamilton, Mass.

[73] Assignee: Genus, Inc., Sunnyvale, Calif.

[21] Appl. No.: 617,293

[22] Filed: Mar. 18, 1996

Related U.S. Application Data

[63] Continuation-in-part of Ser. No. 343,116, Nov. 22, 1994, Pat. No. 5,501,993.

[51] Int. Cl.$^6$ ............................. H01L 29/76; H01L 29/94
[52] U.S. Cl. .................. 257/369; 257/371; 257/372; 257/351; 257/350; 438/228; 438/526; 438/529
[58] Field of Search .................................. 438/228, 526, 438/529; 257/369, 370, 371, 372, 204, 206, 338, 351, 350, 357, 358, 359

[56] References Cited

U.S. PATENT DOCUMENTS

| | | | |
|---|---|---|---|
| 4,710,477 | 12/1987 | Chen | 437/34 |
| 5,160,996 | 11/1992 | Odanaka | 257/375 |
| 5,292,671 | 3/1994 | Odanaka | 437/29 |
| 5,384,279 | 1/1995 | Stolmeijer et al. | 437/57 |

OTHER PUBLICATIONS

Diffusion/Implantation, Dec. 1993, "MeV Implantation Technology Next–generation manufacturing with current–generation equipment" John Ogawa Borland, Ron Koelsch. brochure pp. 1–8.

Fowler, "MosFet Devices with high–gate dielectric integrity", IBM TDB, vol. 17, No. 1, Jun. 1974.

*Primary Examiner*—Carl W. Whitehead
*Attorney, Agent, or Firm*—Nields, Lemack & Dingman

[57] ABSTRACT

CMOS vertically modulated wells have a structure with a buried implanted layer for lateral isolation (BILLI). This structure includes a field oxide area, a first retrograde well of a first conductivity type, a second retrograde well of a second conductivity type adjacent the first well, and a BILLI layer below the first well and connected to the second well by a vertical portion. This structure has a distribution in depth underneath the field oxide which kills lateral beta while preventing damage near the surface under the field oxide.

15 Claims, 18 Drawing Sheets

| WELL & SUBSTRATE | TRIGGER CURRENT (A/UM) |
| --- | --- |
| DIFFUSED WELL + EPI WAFER (4UM) | 6.4E−4 |
| DIFFUSED WELL ON BULK WAFER | 6.4E−5 |
| DIFFUSED WELL + MeV BLANKET BURIED LAYER | 3E−4 |
| DIFFUSED WELL + MeV BILLI STRUCTURE | 7.2E−4 |

FIG. 14

| | $B_V$ | $B_L$ | $B_V B_L$ | p+ TRIG | n+ TRIG | LATCH-UP |
|---|---|---|---|---|---|---|
| DIFF.NW | | | | 3.5 | 2.3 | |
| BL+NW 8E12 | 11 | 0.25 | 2.75 | 12.5 | 8.5 | |
| BILLI+NW 8E12 | 15 | 0.015 | 0.23 | 13 | 20 | $B_V > 1.5X$ $B_L <$ kill $B_L$ |
| BL+NW 2E13 | 4 | 0.4 | 1.6 | 16.5 | 17.5 | $B_V < 3X$ $B_L >$ Efield |

FIG. 15

SEMICONDUCTOR DEVICE HAVING AT LEAST ONE FIELD OXIDE AREA AND CMOS VERTICALLY MODULATED WELLS (VMW) WITH A BURIED IMPLANTED LAYER FOR LATERAL ISOLATION HAVING A FIRST PORTION BELOW A WELL, A SECOND PORTION FORMING ANOTHER, ADJACENT WELL, AND A VERTICAL PO

This is a Continuation-In-Part of U.S. Ser. No. 08/343,116 filed on Nov. 22, 1994 now U.S. Pat. No. 5,501,993.

BACKGROUND OF THE INVENTION

1. Field of the Invention

The present invention relates to simplification of a manufacturing process for complementary semiconductor devices, which are becoming increasingly miniaturized and increasingly complex, to a high component-density semiconductor device having enhanced resistance to CMOS latch-up, and to well formation (single, twin, triple).

2. Description of the Related Art

The importance of CMOS technology in the VLSI field has grown, as a result of requirements for a high noise margin and low power consumption. However, as miniaturization has increased, serious problems have arisen with regard to preventing stray thyristor operation which causes the CMOS latch-up phenomenon to occur between mutually adjacent portions of an n-channel MOSFET and p-channel MOSFET, and with regard to maintaining a sufficient level of withstanding voltage between mutually adjacent elements.

Various forms of device configuration and manufacturing process have been proposed for overcoming these problems. These proposals include the use of a configuration containing wells, formation of a buried high concentration layer, and formation of a self-aligned channel stop at the edge of a well region.

Summaries of these various structures and methods have been presented, for example, in U.S. Pat. No. 5,160,996 at column 1 line 34 et seq. Additional disclosure of this technology appears in the article entitled "MeV implantation technology: Next-generation manufacturing with current-generation equipment" by Borland and Koelsch in the December 1993 issue of Solid State Technology.

SUMMARY OF THE INVENTION

The present invention solves the following problems:
1) single, twin and triple well CMOS process simplification:
   a) total number of steps
   b) 2–3 mask levels
   c) manufacturing time and cost reduction
   d) clustering well, isolation and channel implants, and $V_t$ implants
   e) clustering through a masking layer
2) clustered implant to reduce wafer handling, particles, process simplification
3) Improved CMOS latch-up, SER, α-particle, GOI, and ESD
4) improved bulk wafer by optimum denuding techniques
5) elimination of Epi for
   a) CMOS
   b) SOI wafer bonding
   c) CCD
6) reduction/elimination of oxygen related implant defects The foregoing problems are solved in the following manner
1) clustered implants up to six into one step
2) BILLI structure formation for latch-up and single, twin and triple well
3) Hydrogen and/or nitrogen denudation for improved Cz wafer and epi elimination The novel features of the invention include the following:
1) clustered implants
2) reduction in masks and process for twin and triple well
3) epi replacement for CMOS, SOI, CCD etc.
4) latch-up free
5) hydrogen passivation
6) oxygen-denuded-zone free
7) defect free
8) implant-related-defect free The features of the present invention may be summarized as follows:
1) CMOS semiconductor device manufacturing process simplification and cost reduction for NMOS and PMOS transistor fabrication:
   a) single n or p well formation on p- or n-substrates.
   b) twin/double n & p well formation on p- or n-substrates.
   c) triple well formation, surface n & p well plus buried n or p well on p- or n-substrate.
   d) Vt implant through a masking layer.
   e) clustered implants; deep retro-well implant/channel stop implant/Vt implant.
      deep retro p or n-well implant/channel stop implant.
      channel stop implant/Vt implant
      deep retro p or n-well implant/channel stop implant/Vt implant.
      deep retro p or n-well implant/channel stop implant/deep retro n or p-well implant/channel stop implant.
      p or n-well channel stop implant/Vt implant/n or p-well channel stop implant/Vt implant.
      deep retro p or n-well implant/channel stop implant/Vt implant/deep retro n or p-well implant/channel stop implant/Vt implant.
   f) clustered implants through a masking layer; deep retro-well implant/channel stop implant/Vt implant.
      deep retro p or n-well implant/channel stop implant.
      channel stop implant/Vt implant
      deep retro p or n-well implant/channel stop implant/Vt implant.
      deep retro p or n-well implant/channel stop implant/deep retro n or p-well implant/channel stop implant.
      p or n-well channel stop implant/Vt implant/n or p-well channel stop implant/Vt implant.
      deep retro p or n-well implant/channel stop implant/Vt implant/deep retro n or p-well implant/channel stop implant/Vt implant.
   g) elimination of 1 to 4 masking layers.
   h) elimination of up to 4 medium current implants and the associated implanters.
   i) improved high energy implanter utilization.
   j) improved high energy implanter productivity by 25%.
   k) cost savings of $25 to $149 per 200 mm wafer.
   l) reduction in masking layer thickness for high energy ion implantation.

2) Improved CMOS latch-up resistance and device scaling/shrink.
   a) reduction in lateral current gain/lateral beta ($B_L$).
   b) reduction in vertical lcurrent gain/vertical beta ($B_V$).
   c) reduction in well resistances ($R_W$).
   d) reduction in substrate resistance ($R_S$).
   e) improved n+ to p+ spacing.
3) Hydrogen and/or nitrogen denudation for improved Cz silicon wafer surface properties.
   a) improved device performance
      gate oxide integrity
      oxide QBD
      junction leakage
      device yield
   b) improved oxygen out diffusion
   c) lower surface oxygen
   d) lower surface defect level
   e) equivalent to epi wafer surface quality
   f) improved resistance to surface native oxide
   g) improved wafer surface roughness
   h) pre-process intrinsic gettering for high energy implant device processing
4) BILLI structure plus improved denudation=epi replacement
   a) CMOS technology
   b) CCD technology

BRIEF DESCRIPTION OF THE DRAWINGS

The invention may best be understood from the following detailed description thereof, having reference to the accompanying drawings, in which:

FIG. 14 is a chart showing latch-up results for the structure of the invention as compared with prior art structures;

FIG. 15 is a chart showing latch-up results for the structure of the invention as compared with prior art structures;

Referring to the drawings, and first to FIG. 1 thereof, FIG. 1 shows a low cost MeV structure in accordance with the invention at the stage in its manufacture at which PMOS devices can be formed in a retrograde n-well and NMOS devices in a retrograde p-well. Although at this stage in its manufacture neither the PMOS devices nor the NMOS devices have been formed, in FIG. 1 PMOS devices are shown, in order to indicate where they will be formed in steps subsequent to said stage. Isolation areas 5 separate adjacent PMOS devices which can be implanted into a retrograde n-well formed in a p-type substrate 10. Adjacent to the series of PMOS devices in an n-well retrograde p-wells have been formed, into which a series of NMOS devices will be implanted in subsequent steps of manufacture. The retrograde n-well includes an upper layer 6 wherein phosphorus ions have been implanted so as to form phosphorus (n) impurity atoms with a density that is produced by 5E12cm-2] and a lower layer 7 wherein phosphorus ions have been implanted so as to form phosphorus (n) impurity atoms with a density that is produced by 3E13cm-2. The retrograde p-well includes an upper layer 8 wherein boron ions have been implanted so as to form boron (p) impurity atoms with a density that is produced by 5E12cm-2] and a lower layer 9 wherein boron ions have been implanted so as to form boron (p) impurity atoms with a density that is produced by 3E13cm-2. The term "upper layer" signifies the layer which is nearer the active surface of the substrate 10 and is 0.5 μm deep. The term "lower layer" signifies the layer which is farther from the active surface of the substrate 10 and is 1.2 μm deep. These are retrograde wells because the impurity-atom density is higher at the lower part of the well than at the upper part of the well.

The BILLI structure is formed by continuance of the boron layers from the depths at which they are formed beneath a thick masking layer, for example: comprising at least 2 μm of photoresist to the depths at which they are formed in the absence of the thick masking layer. The latter depths are under the retrograde n-well, deeper than both the upper layer 6 and the lower layer 7, and the layers at these depths are designated "buried". The boron layers at these depths thus form a "buried implanted layer for lateral isolation" or "BILLI" structure, since they surround the n-well around the sides and the bottom. This BILLI structure provides best latch-up resistance for miminum n+ to p+ spacing even over epi-wafers. When combined with optimum denudation, this BILLI structure on bulk Cz wafers can lead to epi replacement.

Figure 1:
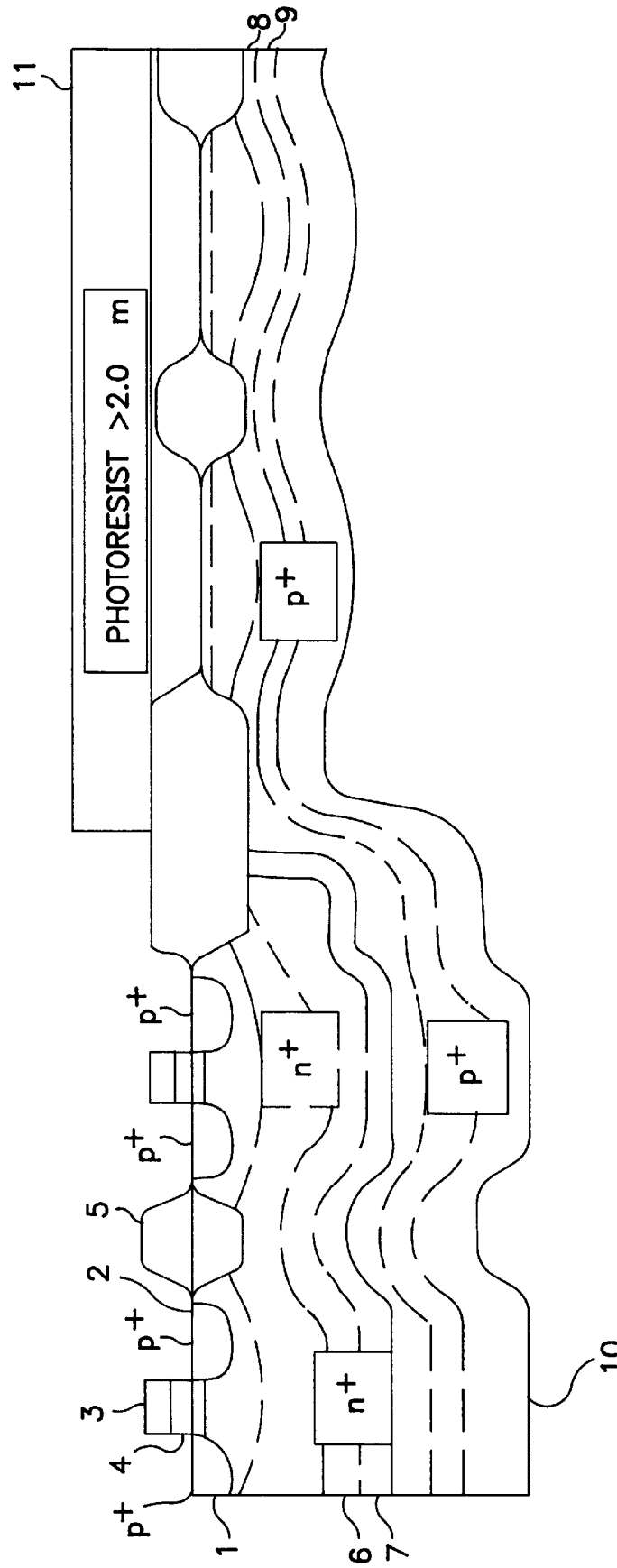
FIG. 1 is a schematic view of a BILLI structure in accordance with the invention.
Figure 3:
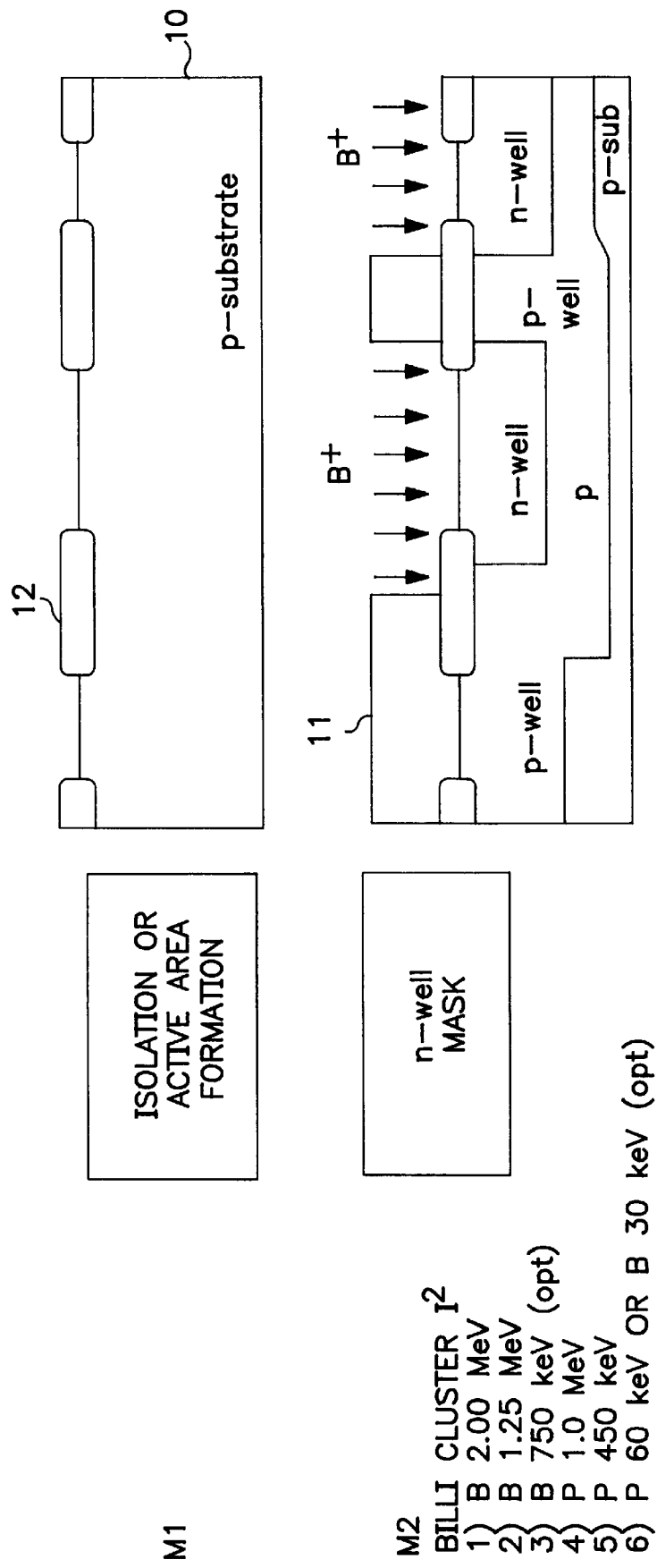
FIG. 3 is a schematic view of the steps involved in manufacturing a BILLI twin-well structure with two masks and clustered implantation.

FIG. 3, in conjunction with FIG. 1, shows a method of forming the BILLI structure in accordance with the invention. This method of the invention not only has the advantage of resulting in the formation of the novel BILLI structure of the invention, but also results in both process simplification and cost reducton for single, twin and triple well formation. A preferred embodiment of the method of the invention comprehends the following steps. First, isolation areas 12 are formed (or, alternatively, active areas are formed) in the substrate 10. Then a mask 11, such as a photoresist mask having a thickness of more than 2.0 μm is placed on the surface as shown to block the phosphorus ions of maximum energy, and a clustered series of four to six implants are carried out.

The clustered series of four to six implants may be carried out as follows: First, boron ions are directed onto the upper surface of the substrate 10 with an energy of 2.00 MeV, thereby forming the lower layer 9 of p-type material (deep retrograde p-well). Second, without removing the substrate 10 from the vacuum chamber in which it was irradiated with boron ions, the parameters of the ion accelerator are changed, and boron ions are directed onto the upper surface of the substrate 10 with an energy of 1.25 MeV, thereby forming the upper layer 8 of p-type material (channel stop implant or shallow retrograde p-well). As an optional third step, without removing the substrate 10 from the vacuum chamber in which it was irradiated with boron ions, the parameters of the ion accelerator are changed, and boron ions are directed onto the upper surface of the substrate 10 with an energy of 750 keV, thereby forming a shallow, thin threshhold voltage layer $V_t$ at the surface of the retrograde p-well 8,9. Fourth, without removing the substrate 10 from the vacuum chamber in which it was irradiated with boron ions, the parameters of the ion accelerator are changed, and phosphorus ions are directed onto the upper surface of the substrate 10 with an energy of 1 MeV, thereby forming the lower layer 7 of n-type material (deep retrograde n-well). Fifth, without removing the substrate 10 from the vacuum chamber in which it was irradiated with boron ions and phosphorus ions, the parameters of the ion accelerator are changed, and phosphorus ions are directed onto the upper surface of the substrate 10 with an energy of 450 keV, thereby forming the upper layer 6 of n-type material (channel stop implant or shallow retrograde n-well). As an optional sixth step, without removing the substrate 10 from the vacuum chamber in which it was irradiated with boron ions and phosphorus ions, the parameters of the ion accelerator are changed, and phosphorus ions are directed onto the upper surface of the substrate 10 with an energy of 60 keV, thereby forming a shallow, thin threshhold voltage layer $V_t$ at the surface of the retrograde n-well 6,7. Alternatively, the sixth step may comprise directing boron ions onto the upper surface of the substrate 10 with an energy of 30 keV so as to form this threshhold voltage layer.

The method of FIG. 3 may be modified by omitting the two optional steps and, in lieu thereof, carrying out a medium current blanket Vt implant after the M1 step and before the M2 step. Alternatively, the sixth step may be omitted and, in lieu thereof, a medium current blanket Vt implant may be carried out after the M1 step and before the M2 step.

The method of FIG. 3 may also be modified to enable certain existing installations to take advantage of the principles of the present invention in forming a BILLI structure. In such a modification the second step of the method of FIG. 3 is omitted, and, after the remaining steps have been carried out, the mask 11 is removed and a mask (such as a photoresist mask having a thickness of more than 2.0 micrometers) is placed on the surface as shown in FIG. 2 to block the boron ions of subsequent additional steps, and then boron ions are directed onto the upper surface of the substrate 10 in a sequence of implants with energies of 750 keV, 300 keV and 20 keV.

Figure 2:
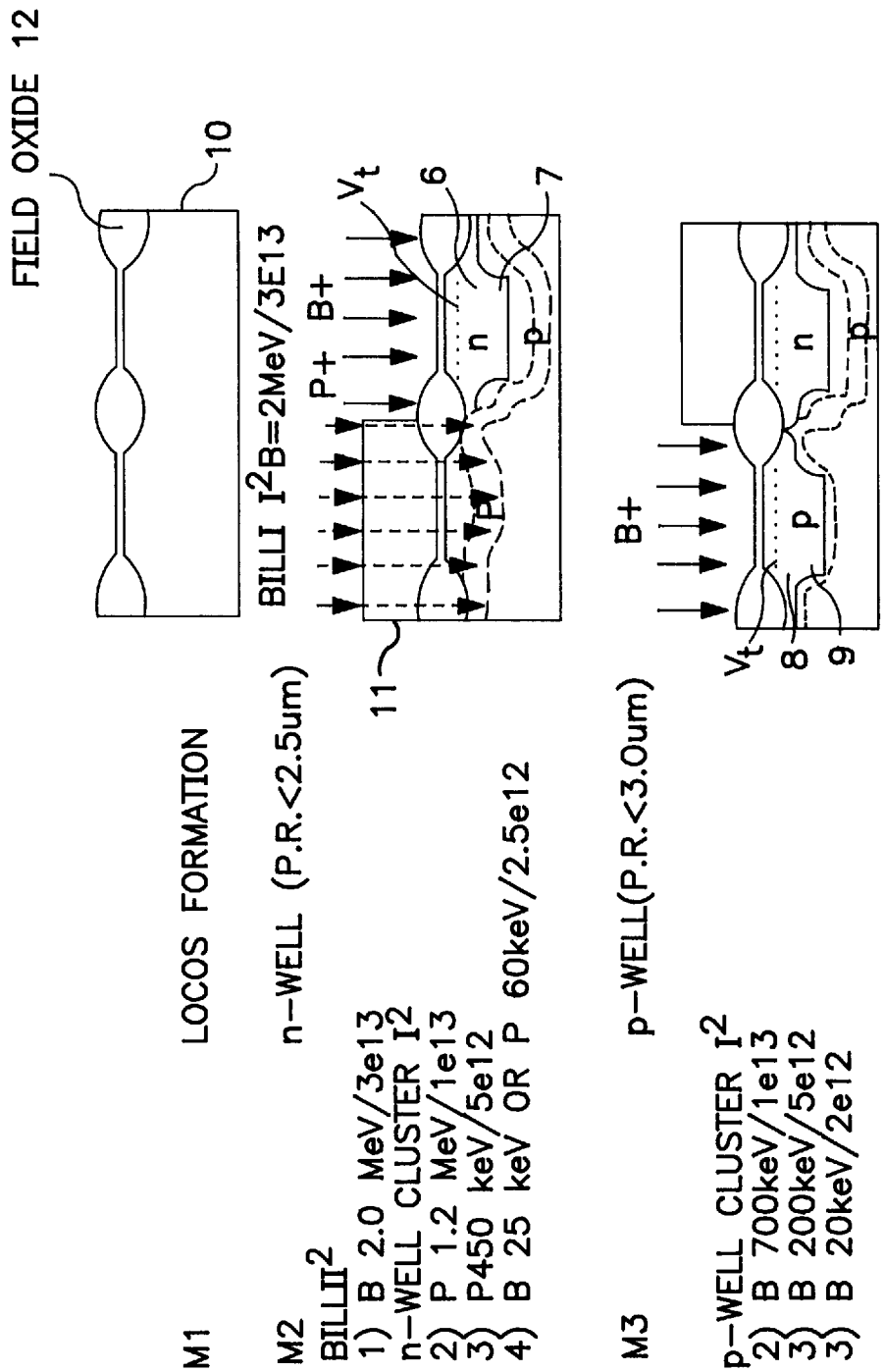
FIG. 2 is a schematic view similar to that of FIG. 3 and showing the placement of a third mask in a modification of the steps shown in FIG. 3 (3-mask BILLI)

More specifically, the method of the embodiment of the invention shown in FIG. 2 comprehends the following steps. First, isolation areas 12 are formed (or, alternatively, active areas are formed) in the substrate 10. Then a mask 11, such as a photoresist mask having a thickness of more than 2.0 μm is placed on the surface as shown to block the phosphorus ions of maximum energy, and a clustered series of three or four implants are carried out.

The clustered series of three or four implants may be carried out as follows: First, boron ions are directed onto the upper surface of the substrate 10 with an energy of 2.00 MeV, thereby forming a p-type buried implanted layer for lateral isolation. Second, without removing the substrate 10 from the vacuum chamber in which it was irradiated with boron ions, the parameters of the ion accelerator are changed, and phosphorus ions are directed onto the upper surface of the substrate 10 with an energy of 1 MeV, thereby forming the lower layer 7 of n-type material (deep retrograde n-well). Third, without removing the substrate 10 from the vacuum chamber in which it was irradiated with boron ions and phosphorus ions, the parameters of the ion accelerator are changed, and phosphorus ions are directed onto the upper surface of the substrate 10 with an energy of 450 keV, thereby forming the upper layer 6 of n-type material (channel stop implant or shallow retrograde n-well). As an optional fourth step, without removing the substrate 10 from the vacuum chamber in which it was irradiated with boron ions and phosphorus ions, the parameters of the ion accelerator are changed, and phosphorus ions are directed onto the upper surface of the substrate 10 with an energy of 60 keV, thereby forming a shallow, thin threshhold voltage layer $V_t$ at the surface of the retrograde n-well 6,7. Alternatively, the fourth step may comprise directing boron ions onto the upper surface of the substrate 10 with an energy of 30 keV so as to form this threshhold voltage layer.

After carrying out the foregoing steps, the mask 11 is removed and a mask (such as a photoresist mask having a thickness of more than 2.0 micrometers) is placed on the surface as shown in FIG. 2 to block the boron ions of subsequent additional steps, and then a second clustered series of one or two implants are carried out.

The second clustered series of one or two implants may be carried out as follows: First, boron ions are directed onto the upper surface of the substrate 10 with an energy of 750 keV, thereby forming the lower layer 9 of p-type material (deep retrograde p-well). Second, without removing the substrate 10 from the vacuum chamber in which it was irradiated with boron ions, the parameters of the ion accelerator are changed, and boron ions are directed onto the upper surface of the substrate 10 with an energy of 300 keV, thereby forming the upper layer 8 of p-type material (channel stop implant or shallow retrograde p-well). As an optional third step, without removing the substrate 10 from the vacuum chamber in which it was irradiated with boron ions, the parameters of the ion accelerator are changed, and boron ions are directed onto the upper surface of the substrate 10 with an energy of 20 keV, thereby forming a shallow, thin threshhold voltage layer $V_t$ at the surface of the retrograde p-well 8,9.

The method of FIGS. 3 and 2 may be still further modified to enable certain other existing installations using diffused well techniques to take advantage of the principles of the present invention in forming a BILLI structure. An example of such a modification is shown in FIG. 5.

Figure 5:
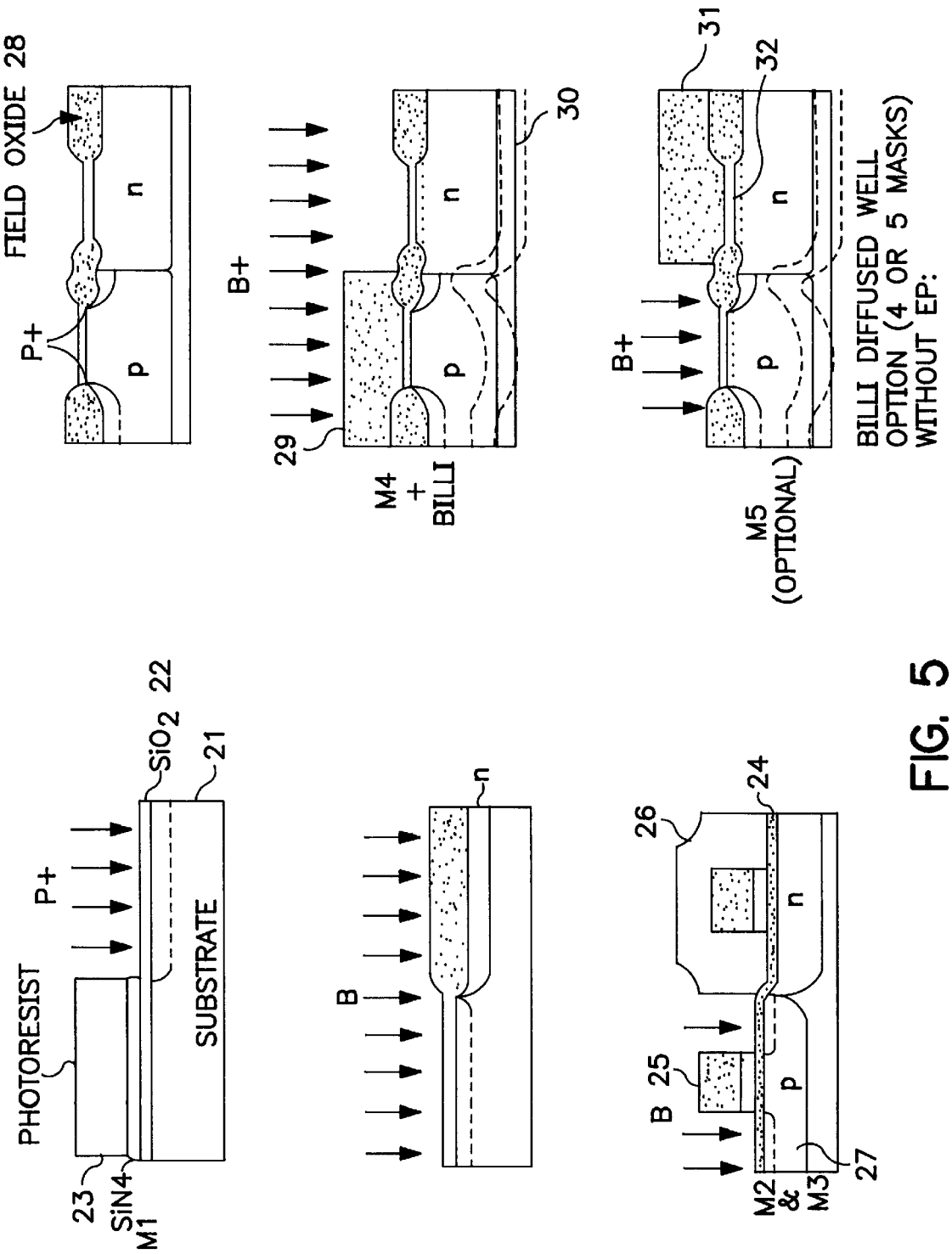
FIG. 5 is a schematic view similar to that of FIG. 3 and showing the steps involved in manufacturing a diffused well structure having a BILLI structure.
Figure 6:
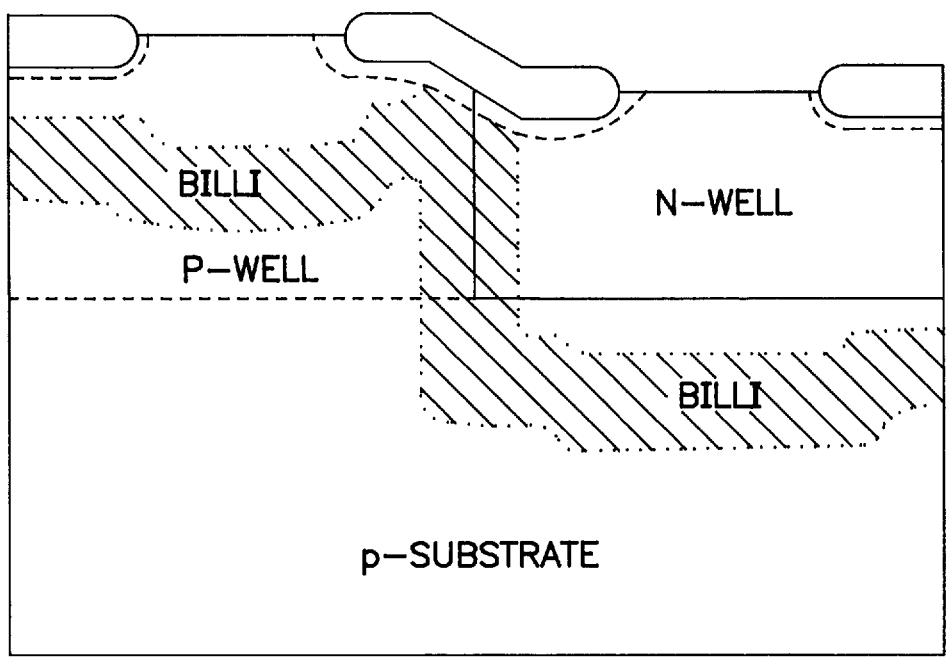
FIG. 6 is a schematic view similar to that of FIG. 1 and showing a diffused well with a MeV BILLI structure.

More specifically, the method of the embodiment of the invention shown in FIG. 5 comprehends the following steps. First, a surface of a substrate 21 is passivated by applying thereto a silicon oxide layer 22. Next, a first mask 23, such as a photoresist mask, is applied to portions of the surface layer 22 as shown. Then phosphorus ions are implanted into the substrate 21 through the silicon oxide layer 22, so as to form an n-well. The resulting article is heated in an oxygen atmosphere, and the presence of the phosphorus dopant causes the thickness of the silicon oxide layer 22 to increase in the region occupied by the phosphorus dopant. Next, boron ions are implanted at 100 keV, so as to form a p-well in regions not protected by the shielding action of the thick silicon oxide portions. After this formation of the p and n wells, the silicon oxide layer 21 of varying thickness is removed, and replaced by a silicon oxide layer 24 of uniform thickness but having a stepped shape. Next, a second mask 25 and a third mask 26 are applied and the substrate 21 is irradiated with boron ions so as to form p+ regions 27 (i.e, p-type regions of high concentration) as indicated. Next, the mask 26 is removed and the article is heated in an oxygen atmosphere so as to form the field oxide regions 28. Next, a fourth mask 29 is applied so as to shield the p-well regions, and a BILLI layer 30 is formed by implanting boron ions of relatively high energy. For example, boron ions may be directed onto the upper surface of the substrate with an energy of 2.00 MeV, thereby forming a p-type buried implanted layer for lateral isolation. If desired, a fifth mask 31 may be applied as shown and Vt implants 32 may be formed by implanting boron ions at relatively low energy.

Figure 8:
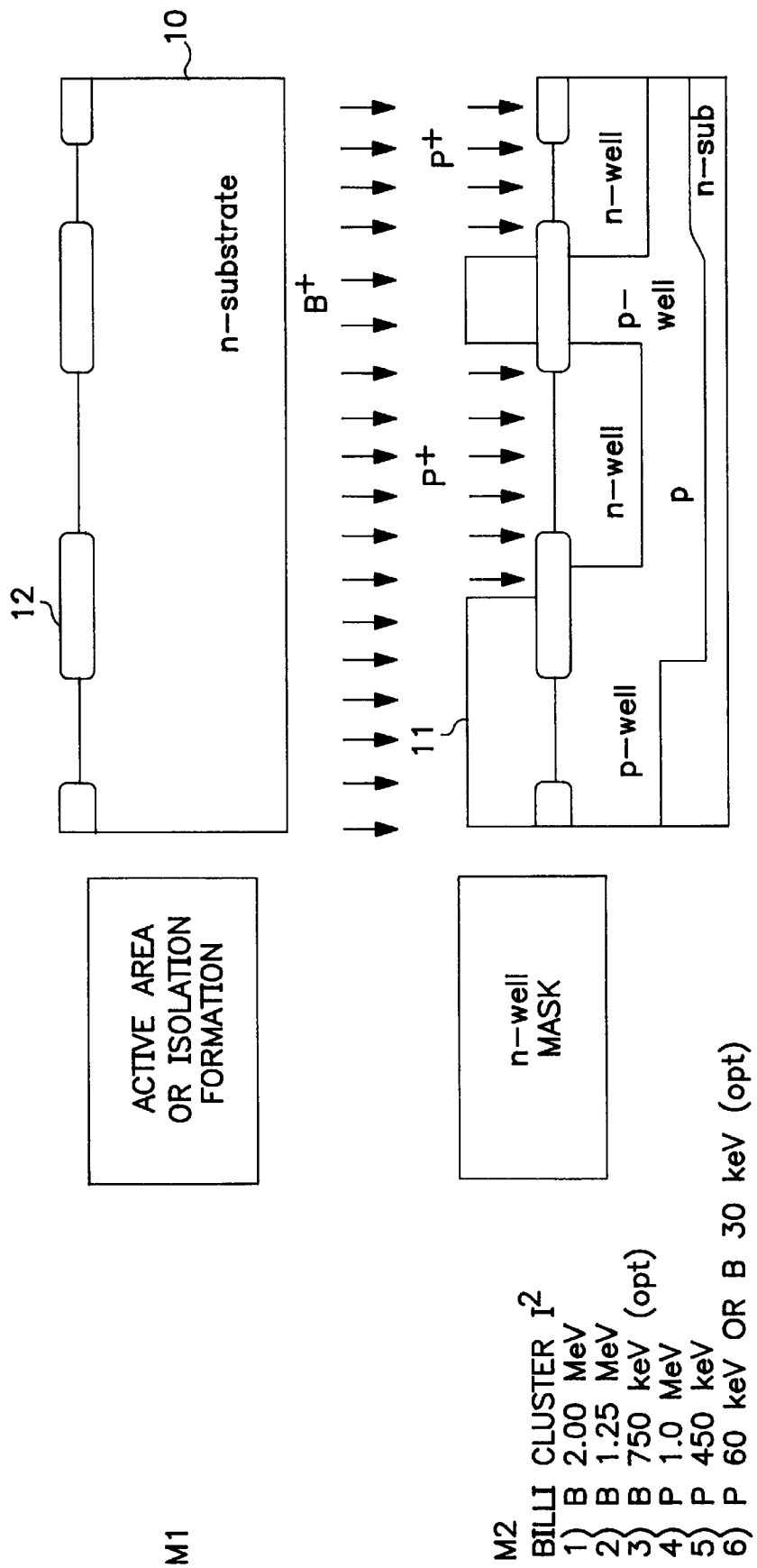
FIG. 8 is a schematic view of the steps involved in manufacturing a BILLI triple-well structure with two masks and clustered implantation.

As shown in FIG. 8, if the steps carried out in the method of FIG. 3 are applied to an n-type substrate, a BILLI triple well structure is formed. Alternatively, a BILLI triple well structure may be formed by the clustered implantation indicated in FIG. 9, wherein the implantation steps are carried out on a p-type substrate in the following sequence.

First, phosphorus ions are directed onto the upper surface of the substrate 110 with an energy of 2.5 MeV, thereby forming the lower layer 109 of n-type material. Second, without removing the substrate 110 from the vacuum chamber in which it was irradiated with phosphorus ions, the parameters of the ion accelerator are changed, and phosphorus ions are directed onto the upper surface of the substrate 110 with an energy of 2.25 MeV, thereby forming the upper layer 108 of n-type material. As an optional third step, without removing the substrate 10 from the vacuum chamber in which it was irradiated with phosphorus ions, the parameters of the ion accelerator are changed, and phosphorus ions are directed onto the upper surface of the substrate 110 with an energy of 2.0 MeV, thereby forming a shallow, thin threshhold voltage layer $V_t$ at the surface of the retrograde n-well 108,109. Fourth, without removing the substrate 110 from the vacuum chamber in which it was irradiated with phosphorus ions, the parameters of the ion accelerator are changed, and boron ions are directed onto the upper surface of the substrate 110 with an energy of 500 keV, thereby forming the lower layer 107 of p-type material. Fifth, without removing the substrate 110 from the vacuum chamber in which it was irradiated with phosphorus ions and boron ions, the parameters of the ion accelerator are changed, and boron ions are directed onto the upper surface of the substrate 110 with an energy of 250 keV, thereby forming the upper layer 106 of p-type material. As an optional sixth step, without removing the substrate 110 from the vacuum chamber in which it was irradiated with phosphorus ions and boron ions, the parameters of the ion accelerator are changed, and boron ions are directed onto the upper surface of the substrate 110 with an energy of 30 keV, thereby forming a shallow, thin threshhold voltage layer $V_t$ at the surface of the retrograde p-well 106,107.

Figure 7:
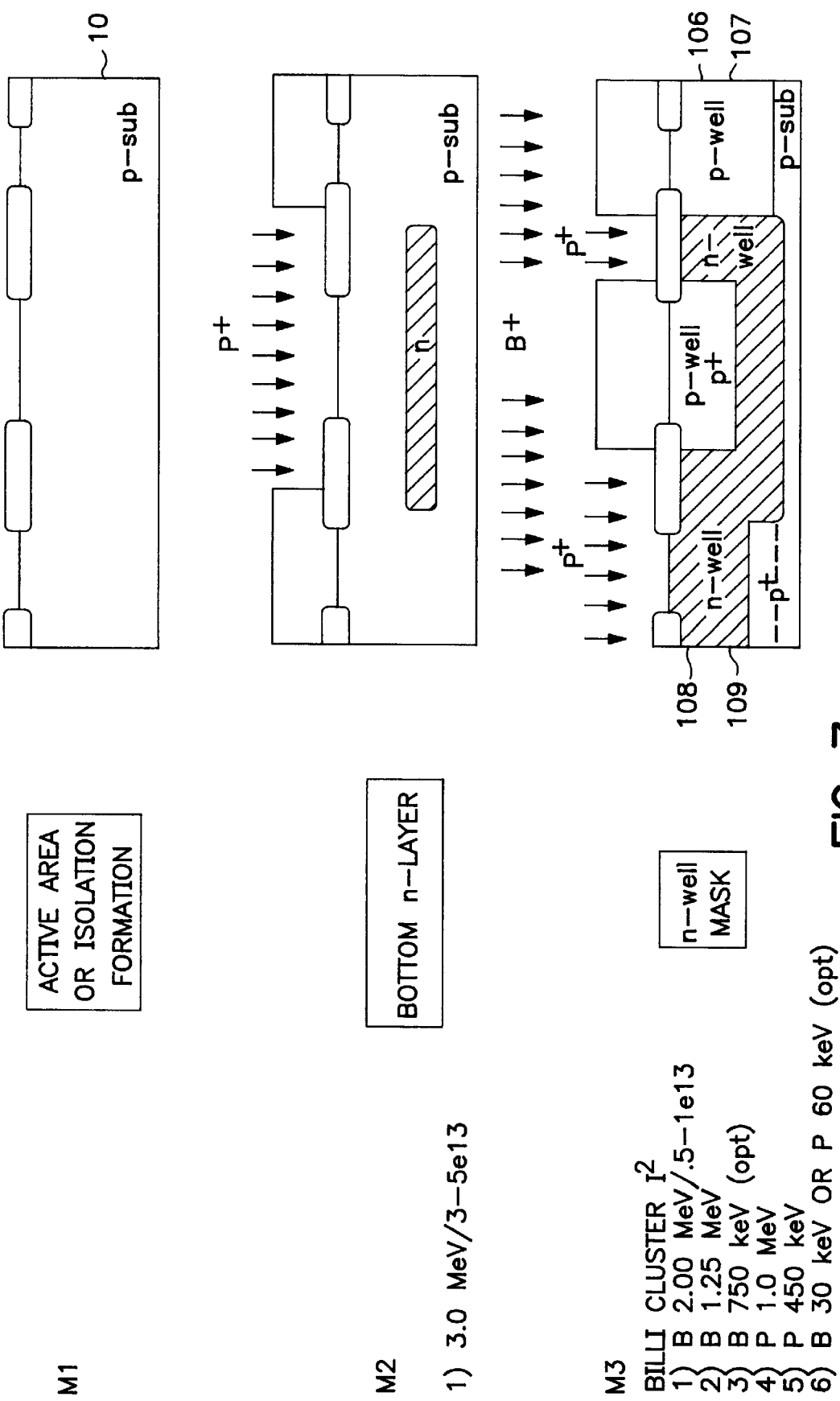
FIG. 7 is a schematic view showing another alternative process to that of FIG. 3.

Alternatively, a BILLI triple well structure may be formed by the clustered implantation indicated in FIG. 7, wherein the bottom ("buried") n-layer is formed prior to the clustered implant steps by a separate implantation of 2.5 MeV phosphorus ions at a current of 3 to 5 E13 through a separate mask, designated "M2" in FIG. 7. The remaining, clustered implantation steps are carried out through a separate mask, designated "M3" in FIG. 7, in the following sequence.

First, boron ions are directed onto the upper surface of the substrate 110 with an energy of 2.0 MeV and a dose of 0.5 to 1 E13, thereby forming the lower layer 107 of p-type material in the p-wells. Second, without removing the substrate 110 from the vacuum chamber in which it was irradiated with boron ions, the parameters of the ion accelerator are changed, and boron ions are directed onto the upper surface of the substrate 110 with an energy of 1.25 MeV, thereby forming the upper layer 106 of p-type material in the p-wells. As an optional third step, without removing the substrate 110 from the vacuum chamber in which it was irradiated with boron ions, the parameters of the ion accelerator are changed, and boron ions are directed onto the upper surface of the substrate 110 with an energy of 750 keV, thereby forming a shallow, thin threshhold voltage layer $V_t$ at the surface of the retrograde p-well 106,107. Fourth, without removing the substrate 110 from the vacuum chamber in which it was irradiated with boron ions, the parameters of the ion accelerator are changed, and phosphorus ions are directed onto the upper surface of the substrate 110 with an energy of 1.0 MeV, thereby forming the lower layer 109 of n-type material. Fifth, without removing the substrate 110 from the vacuum chamber in which it was irradiated with boron ions and phosphorus ions, the parameters of the ion accelerator are changed, and phosphorus ions are directed onto the upper surface of the substrate 110 with an energy of 450 keV, thereby forming the upper layer 108 of n-type material. As an optional sixth step, without removing the substrate 110 from the vacuum chamber in which it was irradiated with boron ions and phosphorus ions, the parameters of the ion accelerator are changed, and boron ions are directed onto the upper surface of the substrate 110 with an energy of 30 keV, thereby forming a shallow, thin threshhold voltage layer $V_t$ at the surface of the retrograde n-well 106,107. Alternatively, the sixth step may comprise directing phosphorus ions onto the upper surface of the substrate 110 with an energy of 60 keV so as to form this threshhold voltage layer.

Figure 9:
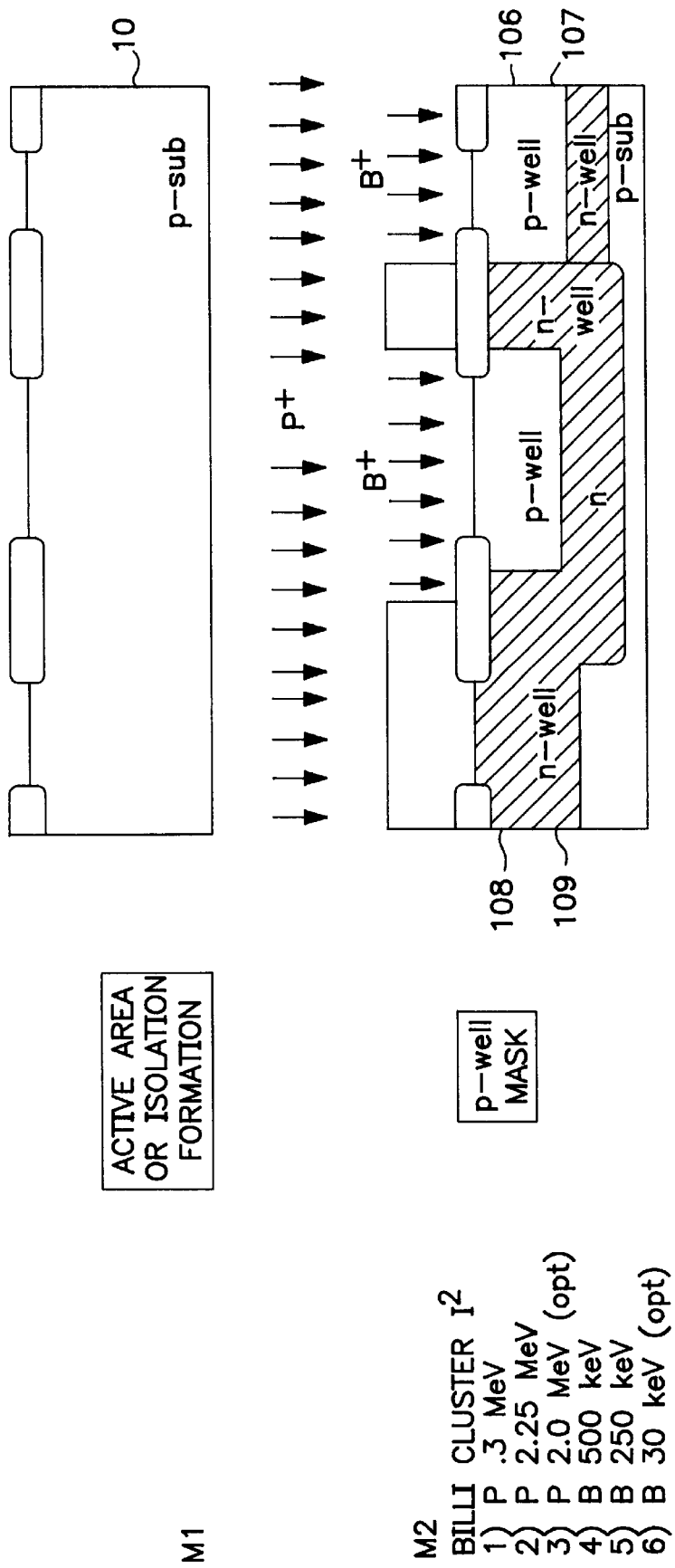
FIG. 9 is a schematic view showing an alternative process to that of FIG. 3.

If the steps carried out in the method of either FIG. 9 or FIG. 7 are applied to an n-type substrate, a BILLI twin-well structure is formed.

In the foregoing description of clustered implantation, the sequence of clustered implantions are carried out by the same ion accelerator. However, if many ion accelerators are available at the same installation, the sequence of clustered implantations may be carried out by separate ion accelerators without departing from the spirit and scope of the invention; it is only necessary to ensure that the same mask is used throughout the sequence of clustered implantations.

Also, in the foregoing description of clustered implantation, representative thicknesses of the masks are set forth, and representative energies of the ions being implanted are set forth. However, the invention is not limited to such thicknesses or energies, and the invention comprehends, in general, phosphorus-ion energies which are insufficient to pass through the mask involved, thus being blocked by the mask, and boron-ion energies which are sufficient to pass through the mask involved.

Additional advantages of the invention are achieved if the implantation and masking steps hereinbefore set forth are carried out on a substrate the surface whereof has been subjected to hydrogen annealing. The resultant hydrogen denudation provides an improved Cz wafer and can eliminate epi. Using the BILLI structure in combination with hydrogen or nitrogen (optimum) denudation for epi replacement results in epi equivalent thin gate oxide quality, excellent junction leakage, improved resistance to RCA wet clean related surface micro-defect formation, improved surface smoothness and very low surface oxygen and defect levels.

In the foregoing description the invention has been described in terms of boron ions and phosphorus ions. However, the invention includes the use of p-type dopants other than boron in lieu of boron ions, as well as the use of n-type dopants other than phosphorus in lieu of phosphorus ions.

Figure 4:
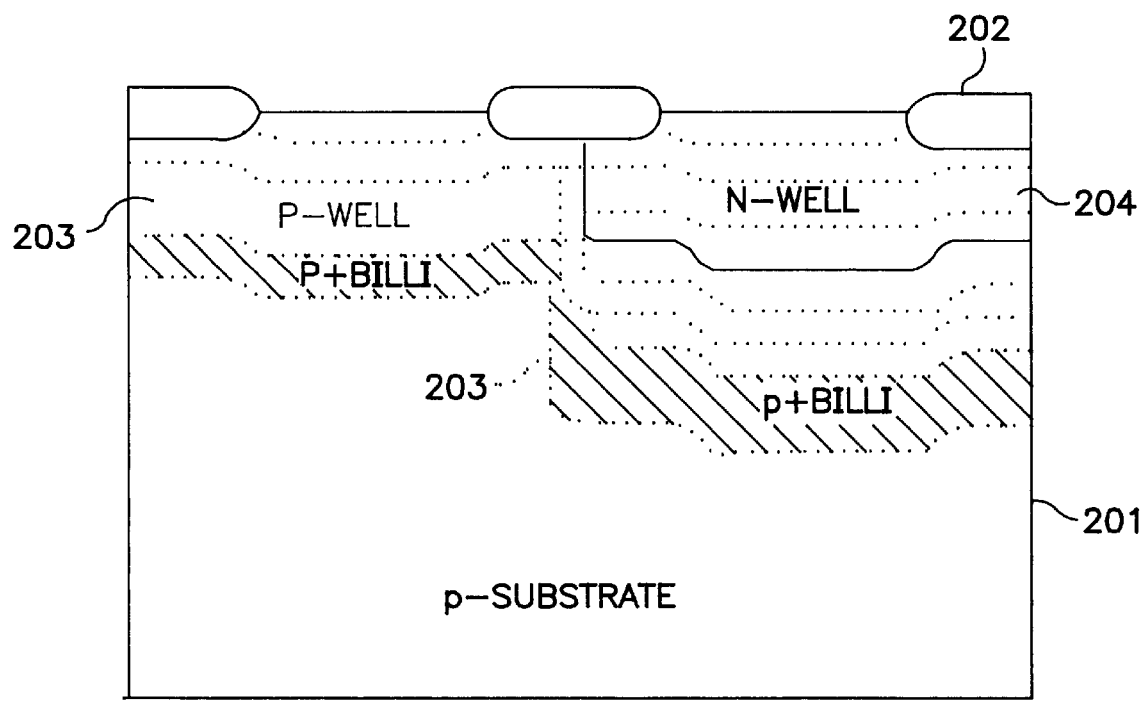
FIG. 4 is a schematic view similar to that of FIG. 1 and showing a MeV BILLI retrograde well.

FIG. 4 shows the BILLI structure of the invention. A substrate 201 includes isolation layers 202 at a surface thereof and at least one p-well 203 and at least one n-well 204 adjacent thereto. The p-well 203 extends underneath the n-well 204 in a manner which provides a BILLI layer 205. In the portion of the p-well 203 lying underneath the n-well 204 at its deepest part, there are three concentration peaks, as may be seen from FIGS. 4 and 10. The deepest peak 206 lies at a depth of 2.9 microns and has a peak concentration of approximately 1E18 ($10^{18}$) atoms per cubic centimeter. The middle peak 207 lies at a depth of 2.0 microns and has a peak concentration of approximately 2E17 atoms per cubic centimeter. The shallowest peak 208 lies at a depth of 1.4 microns and has a peak concentration of approximately 4E16 atoms per cubic centimeter. The deepest peak 206 is produced by implanting 2 MeV boron ions at a dose of 3e13, the middle peak 207 is produced by implanting 1.25 MeV boron ions at a dose of 5e12, and the shallowest peak 208 is produced by implanting 750 keV boron ions at a dose of 1e12. FIG. 11 shows the concentration distribution in depth produced by the 2 MeV boron implant alone, from which it can be seen that the contribution of this implant to the concentration in layers shallower than the peak concentration at 2.9 microns is negligible. The same is true of the other boron implants. It may be noted that the silicon concentration is of the order of E15. If the peaks are too far apart, decoupling results and the advantage of the BILLI layer of the invention is not achieved.

Figure 12:
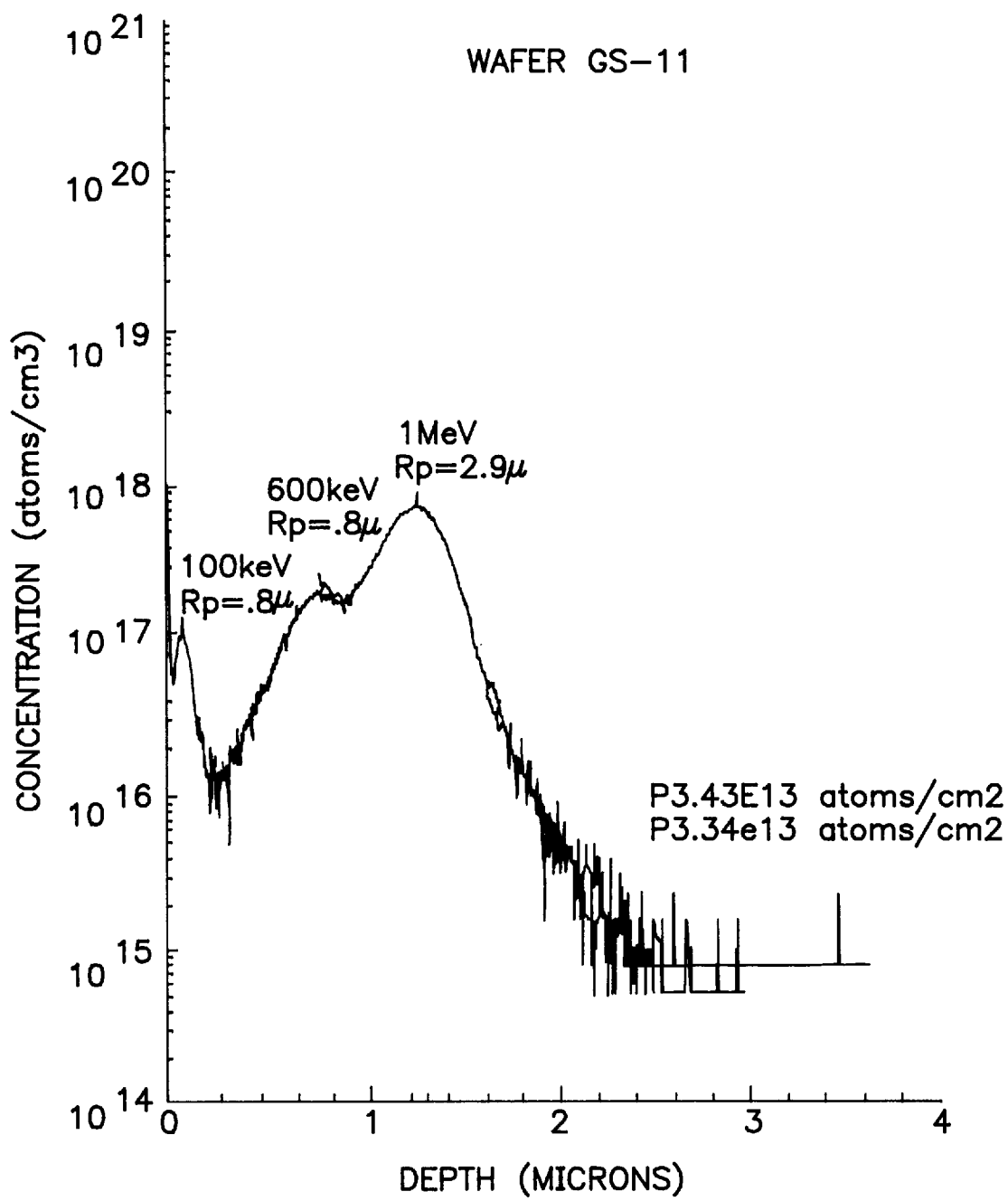
FIG. 12 is a graph in which concentration of phosphorus is plotted against depth for the right side of FIG. 9.

In the n-well 204, there are three concentration peaks, as may be seen from FIGS. 4 and 12. The deepest peak 209 lies at a depth of 1.3 microns and has a peak concentration of approximately 1E18 ($10^{18}$) atoms per cubic centimeter. The middle peak 210 lies at a depth of 0.8 microns and has a peak concentration of approximately 2E17 atoms per cubic centimeter. The shallowest peak 211 lies at a depth of 0.1 microns and has a peak concentration of approximately 1E17 atoms per cubic centimeter. The deepest peak 209 is produced by implanting 1 MeV phosphorus ions at a dose of 3.0 E13 atoms per square centimeter, the middle peak 210 is produced by implanting 600 keV phosphorus ions at a dose of 5 E12 atoms per square centimeter, and the shallowest peak 211 is produced by implanting 60 keV phosphorus ions at a dose of 3 E12 atoms per square centimeter. It can be seen that the peak concentrations are comparable to those of the boron implantations, and so the concentration distribution in depth of the p-well 203 proper, lying adjacent the n-well, is comparable to that of the n-well 204.

Figure 10:
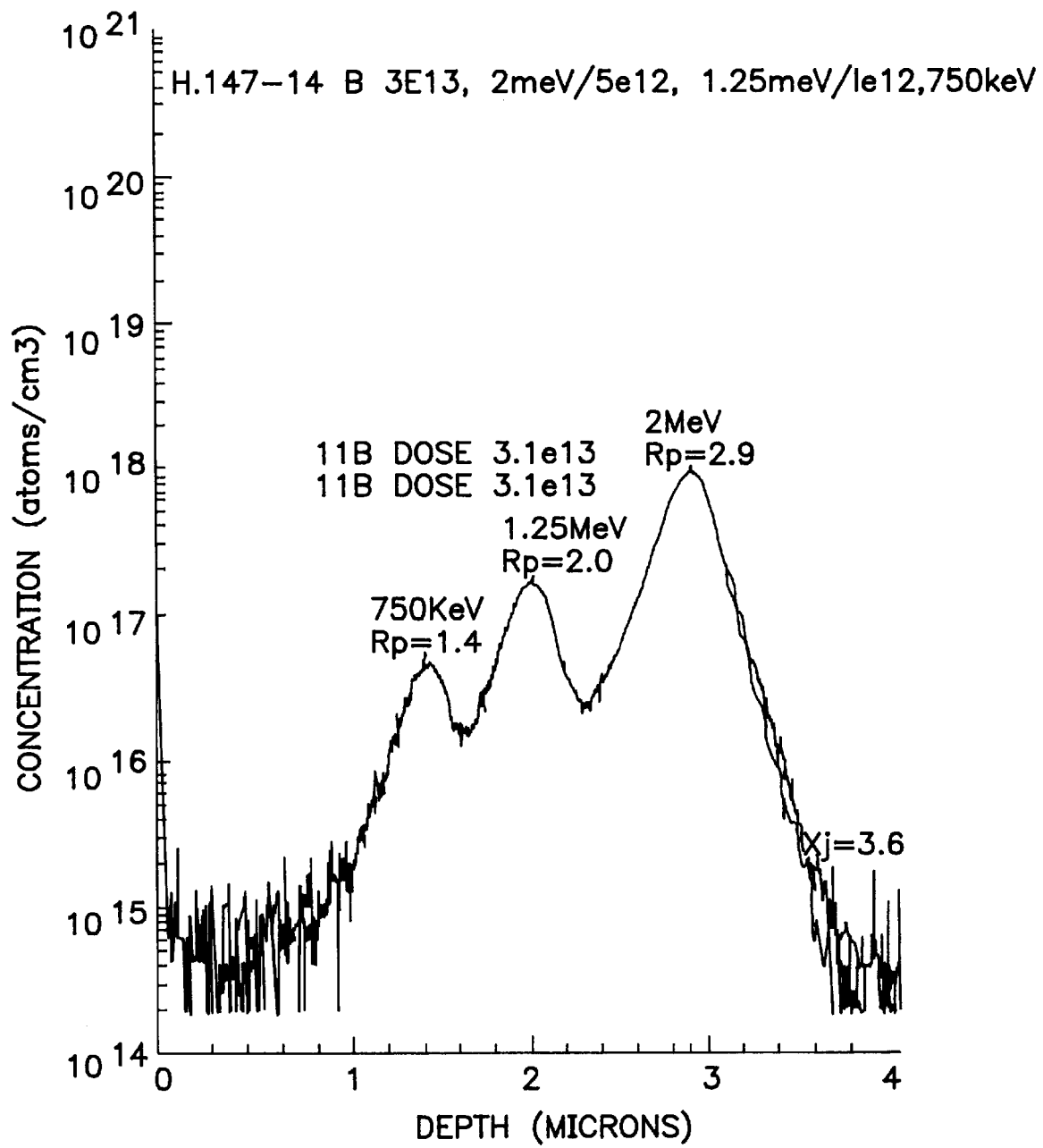
FIG. 10 is a graph in which concentration of boron is plotted against depth for the right side of FIG. 4.
Figure 11:
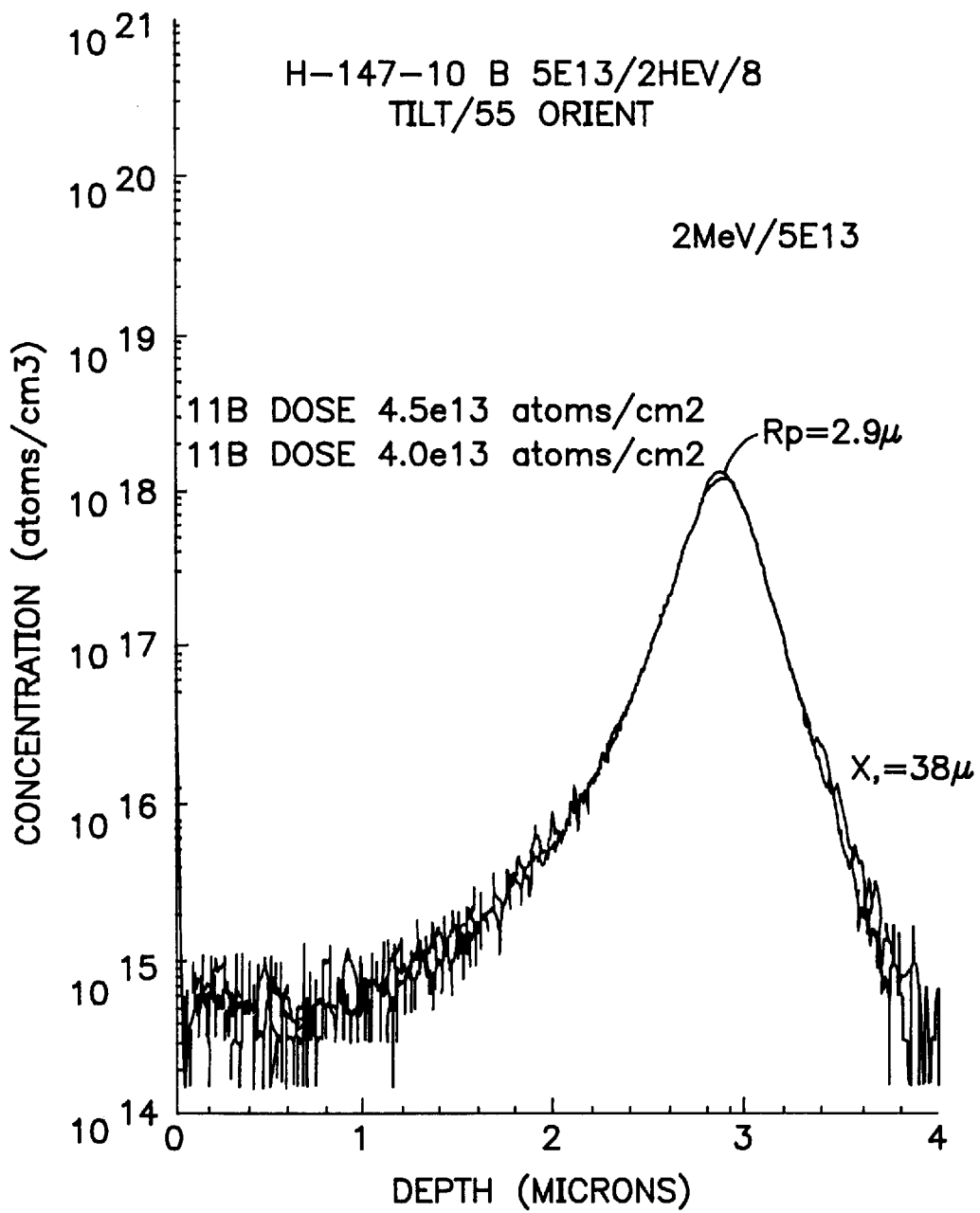
FIG. 11 is a graph in which concentration of boron is plotted against depth for a 2 MeV implant of the type shown in FIG. 10.

It is to be noted from FIG. 10 that, despite the high concentration at a depth of 3 microns, the concentration up to a depth of 1 micron is comparable to that of the silicon.

Figure 13:
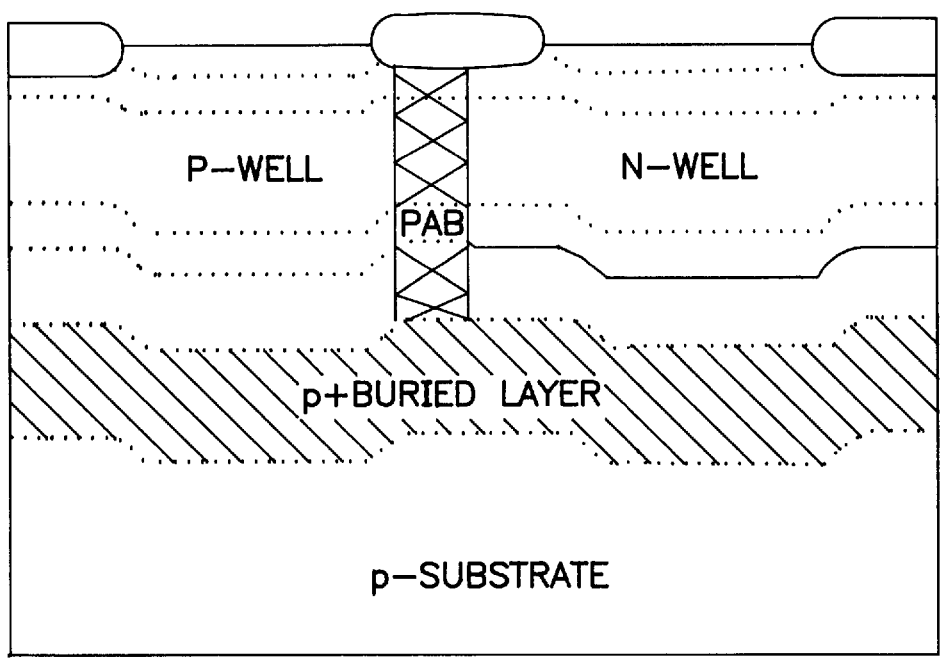
FIG. 13 is a schematic view similar to that of FIG. 1 and showing a prior art structure.

FIG. 13 shows a prior-art proposal in which a MeV Retrograde Well is combined with a MeV blanket buried layer and a so-called "PAB" vertical MeV isolation implant. The formation of such a structure required four masks, and there are 62 process steps to gate. There are 8 implants. Epi replacement is achieved and the latchup prevention $B_V \times B_L$ is very good but the n+ to p+ spacing is limited due to the added mask. Photoresist thickness is more than 3.5 microns. The cost savings is $150. Two additional high-dose ion implantations are required; there is photoresist outgassing; defects are created in the article implanted; the use of high temperature anneals requires denuding. This proposal is disclosed in the Tsukamoto presentation cited at reference (1) of the aforementioned article by Borland and Koelsch.

The aforementioned U.S. Pat. No. 5,160,996 to Odanaka shows a prior-art proposal in which the vertical high-concentration region is produced by a single implant through a mask the edge whereof coincides with an isolation area. The transition from the shallow implant under the mask to the deep implant under the opening, caused by the mask edge in conjunction with the effect of the field oxide, produces the desired vertical region for lateral isolation. However, as is shown by the concentration diagrams of the patents, the dose near the surface under the field oxide is high, and damage is caused to the article implanted.

The BILLI structure and method of the present invention avoids the additional steps of the PAB technique, and avoids the article damage of the Odanaka technique, by the use of implantation energy sufficiently high to avoid high-dose implant near the surface regions.

It will be noted that, in the BILLI structure of FIGS. 4, 10, 11 and 12, underneath the field oxide the boron concentration distribution in depth varies from a low but not negligible value directly under the field oxide to a maximum value at a depth of about 3 microns. Thus there is sufficient boron concentration to kill lateral beta, but the concentration near the surface is restrained so as to prevent damage to the semiconductor material. This vertical portion is created without the complexity of the PAB method and without the damaging effect of the Odanaka method.

The superior results of the structure of the invention is shown by the measurements of lateral beta shown in FIGS. 14–15.

Figure 16:
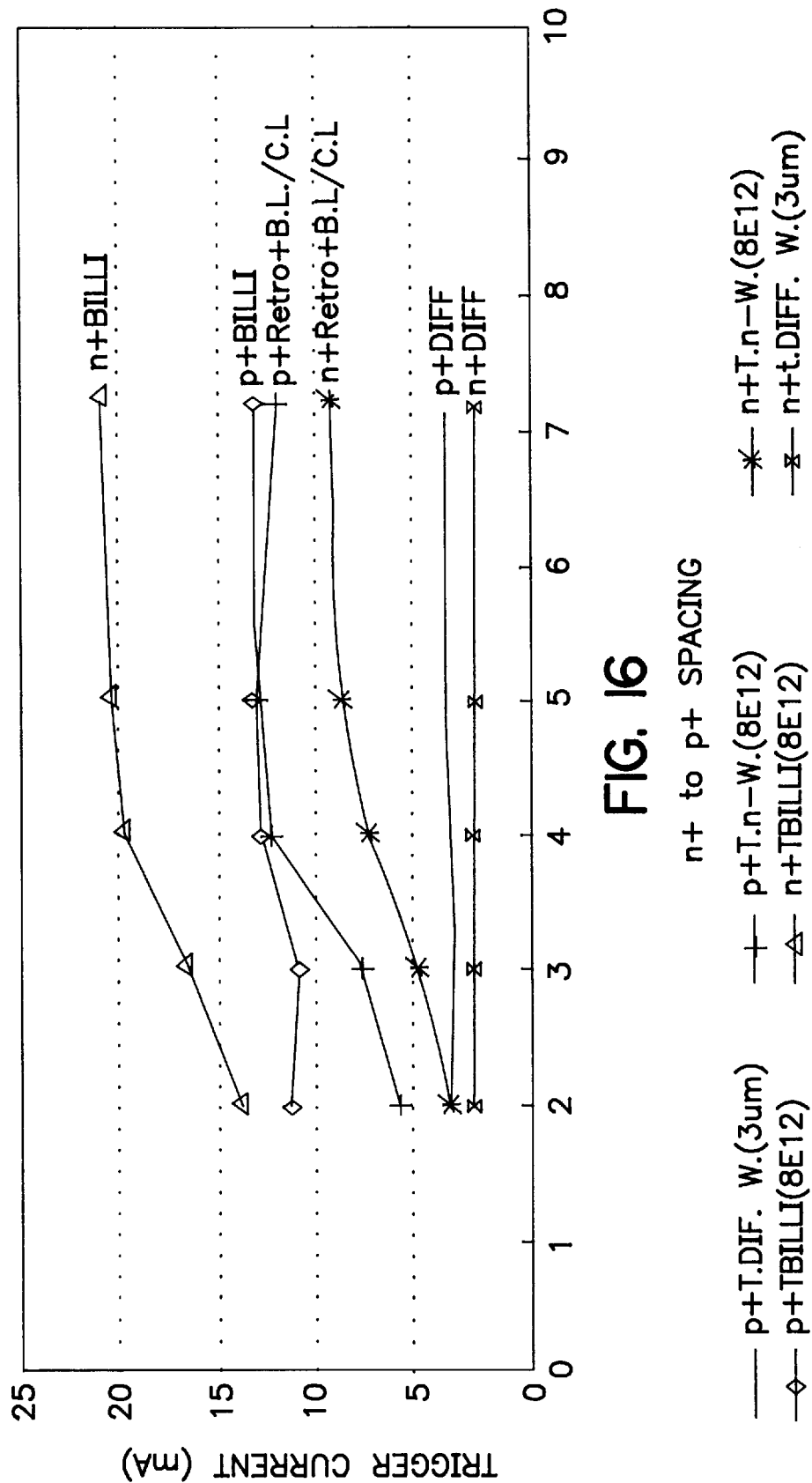
FIG. 16 is a chart showing latch-up results for the structure of the invention as compared with prior art structures.

The graphs of FIG. 16 show the reduction in latch-up produced by the BILLI structure as compared with other structures. The trigger current shown is that current required to initiate latch-up, and hence higher values for this trigger current indicate lower tendency for latch-up to occur.

Figure 17:
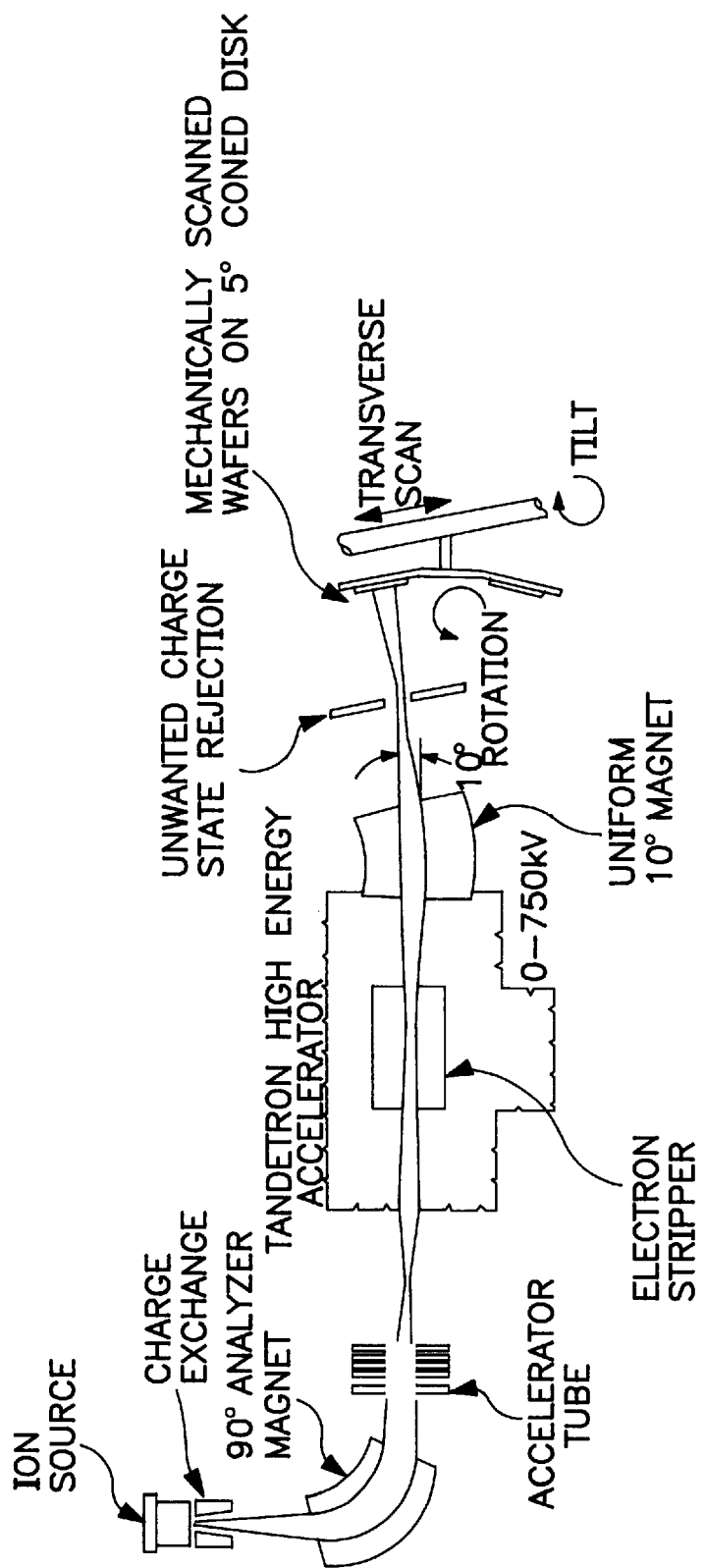
FIG. 17 is a diagrammatic view of apparatus suitable for carrying out the invention.
Figure 18:
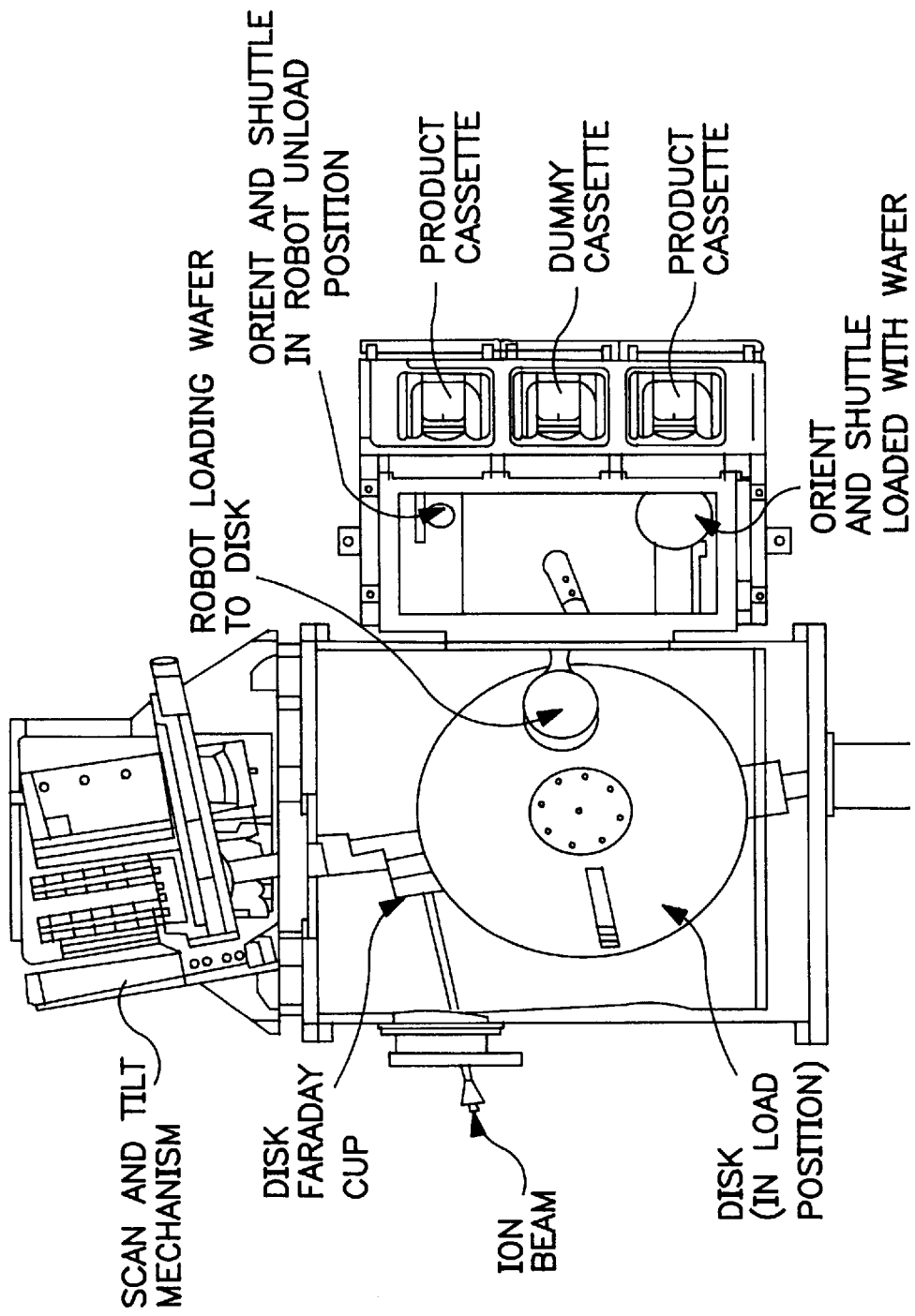
FIG. 18 is a detailed view of a portion of the apparatus of FIG. 17.

Suitable apparatus for making the product of the invention by means of the method of the invention is shown in FIGS. 17 and 18. FIG. 17 shows an ion implantation system. The process chamber and wafer handler modules of the system of FIG. 17 are shown in FIG. 18. Wafers to be implanted are loaded to the disk from a product cassette by means of a robot providing orientation and shuttle movement. The disk is mounted within a vacuum chamber which is sealed off from atmosphere after loading. A scan and tilt mechanism enables movement of the disk to be controlled from outside the vacuum chamber. An ion accelerator produces an ion beam which is injected into the vacuum chamber. The parameters of the accelerator, such as energy, beam current, and type of ion, can be varied without disturbing the vacuum in the vacuum chamber. The vacuum chamber is preferably of relatively large volume, such as about 1600 liters, in order to control the effects of photoresist outgassing and in order to permit the various motions of the disk.

Suitable apparatus for making the product of the invention by means of the method of the invention is also shown in U.S. Pat. No. 4,745,287 to Turner, U.S. Pat. No. 4,980,556 to O'Connor et al., U.S. Pat. No. 5,162,699 to Tokoro et al., U.S. Pat. No. 5,300,891 to Tokoro, U.S. Pat. No. 5,306,922 to O'Connor, and U.S. Pat. No. 5,486,702 to O'Connor et al.

Having thus described the principles of the invention, together with several illustrative embodiments thereof, it is to be understood that, although specific terms are employed, they are used in a generic and descriptive sense, and not for purposes of limitation, the scope of the invention being set forth in the following claims.

I claim:

1. A semiconductor device comprising in combination
   a p-substrate having an impurity concentration of $10^{15}/cc$ and a surface having at least one field oxide area
   a retrograde n-well therein having a high concentration portion having a concentration of about $10^{18}/cc$ extending between a depth of 1 micron and a depth of 2 microns, and extending parallel to said surface from a point under said field oxide area in a first direction, and
   a BILLI p-layer therein having a concentration of about $10^{18}/cc$,
   having a very deep horizontal portion below said n-well at a depth of about 3 microns,
   having a deep horizontal portion forming a deep retrograde p-well, adjacent said n-well, which extends between a depth of 1 micron and 1.5 micron and which extends parallel to said surface from said point in a second direction opposite to said first direction, and
   having a vertical portion connecting said very deep horizontal portion to said deep horizontal portion,
   said surface having active sites separated by said field oxide area,
   said field oxide area extending along said surface in said first and second directions no more than 3 microns,
   the impurity concentration distribution in depth underneath the field oxide varying from a low but not negligible value directly under the field oxide to a maximum value at about 3 microns, thereby providing sufficient impurity concentration to kill lateral beta while restraining the concentration near the surface so as to prevent damage to the semiconductor material.

2. A semiconductor device according to claim 1, wherein said vertical portion extends close to said field oxide area.

3. A semiconductor device according to claim 1 and including a shallow retrograde p-well therein having a concentration of about $10^{16}/cc$ extending to a depth of 0.5 micron above said deep retrograde p-well.

4. A semiconductor device comprising in combination
   a p-substrate having an impurity concentration of $10^{15}/cc$ and a surface having at least one field oxide area,
   an n-well therein having a flat surface profile concentration of about $10^{16}/cc$ extending to a depth of 3 microns, and extending parallel to said surface from a point under said field oxide area in a first direction,
   a p-well therein having a flat surface profile concentration of $10^{16}/cc$ extending to a depth of 3 microns, and extending parallel to said surface from a point under said field oxide area in a second direction opposite to said first direction, and
   a BILLI p-layer therein having a concentration between $10^{17}$ and $10^{18}/cc$,
   having a very deep horizontal portion below said n-well which extends between a depth of 3 microns and a depth of 5 microns,
   having a deep horizontal portion, adjacent said n-well, which extends between a depth of 1 micron and 1.5 micron and which extends parallel to said surface from said point in said second direction, and
   having a vertical portion connecting said very deep horizontal portion to said deep horizontal portion,
   said surface having active sites separated by said field oxide area,
   said field oxide area extending along said surface in said first and second directions no more than 3 microns,
   the impurity concentration distribution in depth underneath the field oxide varying from a low but not negligible value directly under the field oxide to a maximum value at about 3 microns, thereby providing sufficient impurity concentration to kill lateral beta while restraining the concentration near the surface so as to prevent damage to the semiconductor material.

5. A semiconductor device according to claim 4, wherein said vertical portion extends close to said field oxide area.

6. A semiconductor device comprising in combination
   an n-substrate having an impurity concentration of $10^{15}/cc$ and a surface having at least one field oxide area
   a retrograde p-well therein having a high concentration portion having a concentration of between $10^{17}$ and $10^{18}/cc$ extending between a depth of 1 micron and a depth of 2 microns, and extending parallel to said surface from a point under said field oxide area in a first direction, and
   a BILLI n-layer therein having a concentration between $10^{17}$ and $10^{18}/cc$,
   having a very deep horizontal portion below said p-well which extends between a depth of 3 microns and a depth of 5 microns,
   having a deep horizontal portion forming a deep retrograde n-well, adjacent said p-well, which extends between a depth of 1 micron and 1.5 micron and which extends parallel to said surface from said point in a second direction opposite to said first direction, and
   having a vertical portion connecting said very deep horizontal portion to said deep horizontal portion.

7. A semiconductor device according to claim 6, wherein said vertical portion extends close to said field oxide area.

8. A semiconductor device according to claim 6 and including
   a shallow retrograde n-well therein having a concentration of $10^{16}/cc$ extending to a depth of 0.5 micron above said deep retrograde n-well.

9. A semiconductor device comprising in combination
   a p-substrate having an impurity concentration of $10^{15}/cc$ and a surface having at least one field oxide area
   a deep buried retrograde n-layer therein having a high concentration portion having a concentration of about $10^{18}/cc$ extending between a depth of 1.5 micron and a depth of 3 microns, and extending parallel to said surface,
   a retrograde n-well therein having a high concentration portion having a concentration of about $10^{18}/cc$ extending between a depth of 1 micron and a depth of 2 microns, and extending parallel to said surface from a point under said field oxide area in a first direction, and
   a BILLI p-layer therein having a concentration of about $10^{17}/cc$,
   having a very deep horizontal portion below said n-well at a depth of about 3 microns, having a deep horizontal portion forming a deep retrograde p-well, adjacent said n-well, which extends between a depth of 1 micron and 1.5 micron and which extends parallel to said surface from said point in a second direction opposite to said first direction, and said surface having active sites separated by said field oxide area, said field oxide area extending along said surface in said first and second directions no more than 3 microns, the impurity concentration distribution in depth underneath the field oxide varying from a low but not negligible value directly under the field oxide to a maximum value at about 3 microns, thereby restraining the concentration near the surface so as to prevent damage to the semiconductor material.

10. A semiconductor device comprising in combination an n-substrate having an impurity concentration of $10^{15}$/cc and a surface having at least one field oxide area a retrograde n-well therein having a high concentration portion having a concentration of between $10^{17}$ and $10^{18}$/cc extending between a depth of 1 micron and a depth of 2 microns, and extending parallel to said surface from a point under said field oxide area in a first direction, and a BILLI p-layer therein having a concentration between $10^{17}$ and $10^{18}$/cc, having a very deep horizontal portion below said n-well which extends between a depth of 3 microns and a depth of 5 microns, having a deep horizontal portion forming a deep retrograde p-well, adjacent said n-well, which extends between a depth of 1 micron and 1.5 micron and which extends parallel to said surface from said point in a second direction opposite to said first direction, and having a vertical portion connecting said very deep horizontal portion to said deep horizontal portion.

11. A semiconductor device according to claim 10, wherein said vertical portion extends close to said field oxide area.

12. A semiconductor device according to claim 10 and including a shallow retrograde p-well therein having a concentration of $10^{16}$/cc extending to a depth of 0.5 micron above said deep retrograde p-well.

13. A semiconductor device comprising in combination a p-substrate having an impurity concentration of $10^{15}$/cc and a surface having at least one field oxide area a retrograde p-well therein having a high concentration portion having a concentration of between $10^{17}$ and $10^{18}$/cc extending between a depth of 1 micron and a depth of 2 microns, and extending parallel to said surface from a point under said field oxide area in a first direction, and a BILLI n-layer therein having a concentration between $10^{17}$ and $10^{18}$/cc, having a very deep horizontal portion below said p-well which extends between a depth of 3 microns and a depth of 5 microns, having a deep horizontal portion forming a deep retrograde n-well, adjacent said p-well, which extends between a depth of 1 micron and 1.5 micron and which extends parallel to said surface from said point in a second direction opposite to said first direction, and having a vertical portion connecting said very deep horizontal portion to said deep horizontal portion.

14. A semiconductor device according to claim 13, wherein said vertical portion extends close to said field oxide area.

15. A semiconductor device according to claim 13 and including a shallow retrograde n-well therein having a concentration of $10^{16}$/cc extending to a depth of 0.5 micron above said deep retrograde n-well.

* * * * *